(12) United States Patent
Wang

(10) Patent No.: US 6,700,822 B1
(45) Date of Patent: Mar. 2, 2004

(54) PRE-DECODER FOR GLITCH FREE WORD LINE ADDRESSING IN A MEMORY DEVICE

(75) Inventor: Tao-Ping Wang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 17 days.

(21) Appl. No.: 10/146,451

(22) Filed: May 15, 2002

(51) Int. Cl.$^7$ .............................................. G11C 16/04
(52) U.S. Cl. ............................ 365/189.05; 365/230.01; 365/230.04; 365/230.06; 365/230.08
(58) Field of Search ........................ 365/189.05, 230.04, 365/230.01, 230.06, 230.08

(56) References Cited

U.S. PATENT DOCUMENTS

| | | | |
|---|---|---|---|
| 5,311,479 A | 5/1994 | Harada | 365/230.06 |
| 5,351,217 A | 9/1994 | Jeon | 365/230.06 |
| 5,428,577 A | 6/1995 | Yumitori et al. | 365/203 |
| 5,852,585 A | 12/1998 | Koshizuka | 365/230.08 |
| 6,009,038 A | * 12/1999 | Koshizuka | 365/230.08 |
| 6,055,206 A | 4/2000 | Tanizaki et al. | 365/230.06 |
| 6,072,732 A | * 6/2000 | McClure | 365/191 |
| 6,201,731 B1 | * 3/2001 | Kamp et al. | 365/185.02 |
| 6,331,950 B1 | * 12/2001 | Kuo et al. | 365/185.18 |
| 6,331,951 B1 | * 12/2001 | Bautista et al. | 365/185.22 |

* cited by examiner

*Primary Examiner*—Richard Elms
*Assistant Examiner*—Pho M. Luu
(74) *Attorney, Agent, or Firm*—George O. Saile; Stephen B. Ackerman; Rosemary L. S. Pike

(57) ABSTRACT

A reset circuit in a memory device applies a reset to the global X-address latch and the local X-address latch. This resets those latches and effectively de-addresses all word lines prior to application of the next address. This eliminates any overlap of main word line signals between successive addresses thereby eliminating a possible glitch that would cause simultaneous word line addressing and potentially a memory read or write error. By terminating the addressing, the address cycle time may be reduced.

26 Claims, 5 Drawing Sheets

US 6,700,822 B1

PRE-DECODER FOR GLITCH FREE WORD LINE ADDRESSING IN A MEMORY DEVICE

BACKGROUND OF THE INVENTION (1) Field of the Invention

The invention generally relates to a method used in semiconductor memory manufacturing and, more particularly, to a method of word line addressing in semiconductor memory devices in the fabrication of integrated circuits (ICs).

(2) Description of Prior Art

SRAMs are an important volatile memory used in applications where fast access speed is desired. In a typical SRAM memory cell, the logic state of the cell is held at a level using a form of latch. While larger and therefore more costly than a dynamic random access memory (DRAM) cell, the SRAM has a faster access time and does not require periodic refreshing. The SRAM memory cells are arranged in one or more arrays and an address decoder is used to select a desired memory cell within an array.

FIG. 1 contains a block diagram of a typical X-decoder used in a semiconductor memory device 60 to select one or more memory cells to be read or written. A clock signal 10 and control signal 12 are applied to the internal clock generator circuit 14. The output of the internal clock generator circuit is the global clock (gclk) 16. A binary address 18 is applied to a buffer 20, the output of which is applied to a pre-decoder 22. The binary address 18 is comprised of n bits where $2^n$ indicates the total number of word lines 38. The gclk 16 and the pre-decoded address out of the pre-decoder 22 are applied to a global X-address latch 24. The global X-address latch 24 holds a new m-bit address Xp 26 on each rising edge (for example) of the gckl 16. The global address signal Xp 26 is applied to the global X-decoder 28, selecting one of the $2^m$ main word lines (MWL) 30. The gclk 16 is also applied to the local X-address latch 32, which then holds a new local address X0 34 on each rising edge (for example) of the gckl 16. Each local address X0 34 is p bits in width allowing selection of one of $2^p$ local word lines 38 from the selected main word line 30. The number of local address lines X0 34 (p) plus the number of global address lines Xp 26 (m) is equal to the number of input address lines 18 (n). Thus, there are a total of $2^{(p+m)}$ (or $2^n$) local word lines that are addressable. The local word address (X0) 34 is applied to the local X-decoder 36 to select one of the $2^p$ word lines 38 from the globally selected main word line (MWL) 30.

FIG. 2 describes the timing relationship between signals in the X-decoder block diagram of FIG. 1. Referring now to both FIG. 1 and FIG. 2, notice that gclk 16 follows clock 10 after a propagation delay. Another delay following application of the gclk 16, global address signals (Xp) 26a and 26b are generated on the output of the global X-address latch 24. Global address signal (Xp) 26a illustrates one valid address occurring after the first pulse of the clock 10 and global address signal (Xp) 26b illustrates a different valid address occurring after the second pulse of the clock 10. Signals on main word lines (MWL) 30a and 30b correspond to decoding of global address signals (Xp) 26a and 26b, respectively after a propagation delay. Signals on main word lines (MWL) 30a and 30b are indicative of two distinct main word lines (MWL) 30a and 30b being selected. Signal X0 34 follows gclk 16 after a brief delay. Signals on the distinct word lines 38a and 38b correspond to the aforementioned main word lines (MWL) 30a and 30b. Word line 38a is selected when both X0 34 and main word line (MWL) 30a are high. Word line 38b is selected when both X0 34 and main word line (MWL) 30b are high. Unfortunately, at time $t_1$ main word line (MWL) 30a is making a high to low transition while main word line (MWL) 30b is making a low to high transition. This occurs while X0 34 is high and results in a glitch 40 creating a condition where both word lines 38a and 38b are selected.

During the period where word lines 38a and 38b are selected, data may be inadvertently written into or read from an improper memory cell location resulting in data corruption or programmed function failure. One method to avoid this problem is to delay the application of signal X0 34 slightly. However, this will degrade the desired speed performance of the memory.

Referring now to FIG. 3, schematically illustrating a typical circuit for the local X-decoder 36 of FIG. 1. A first NMOS transistor 42 is provided with its source terminal connected to signal ground and its drain terminal connected to word line 38. Signal MWLB 31, which is the complement of signal MWL 30, is provided from the global X-decoder 28 and is applied to the gate terminal of first NMOS transistor 42. A PMOS transistor 44 is provided with its source terminal connected to word line 38. Signals X0 34 (supplied by the local X-address latch 32) and MWLB 31 are connected to the drain and gate terminals of PMOS transistor 44, respectively. XOB 35 which is the complement of X0 34 (also supplied from the local X-address latch 32) is applied to the gate terminal of a second NMOS transistor 46. The drain and source terminals of second NMOS transistor 46 are connected to word line 38 and signal ground, respectively.

Referring now to FIGS. 3 and 4, a description of the operation of a prior art local X-decoder is given. Signal clock 10 initiates each addressing sequence and completes said addressing within one cycle of clock 10. When not addressed, MWLB 31 is high (logic 1) pulling word line 38 low (logic 0) through NMOS transistor 42. On an addressed word line 38, the signals MWLB 31, X0 34 and XOB 35 become low (logic 0), high (logic 1) and low, respectively, some delay after a rising edge (for example) of clock 10. This method requires that the signal MWLB 31 be held low during the cycle duration rather than being prepared to address the next memory location thereby limiting the cycle time of clock 10.

Other approaches related to improving memory device decoding and addressing exist. U.S. Pat. No. 5,311,474 considered to Harada describes a method where a pre-decoding circuit used in a semiconductor memory generates complementary decoding signals with approximately equal time delays. This results in reduced current and an improvement in decoding speed. U.S. Pat. No. 5,351,217 considered to Jeon teaches a method reducing the word line capacitance in a semiconductor memory while enabling and disabling the word line. This is accomplished using a modified row decoder, reset level converter and word line driver/controller and results in speed improvement in the memory device. U.S. Pat. No. 5,428,577 considered to Yumitori et al. teaches a method using a word line voltage boosting circuit in a pre-decoder. The boosting circuit charges the signal path prior to application of the word line drive signal thereby improving performance. U.S. Pat. No. 5,852,585 considered to Koshizuka teaches a method where faster addressing speed is achieved by pre-decoding an address prior to application of the address to a latch. The pre-decoding is done simultaneously with the generation of an internal latching pulse thereby improving the access time. U.S. Pat.

No. 6,055,206 considered to Tanizaki et aL teaches a method where a hierarchical supply is provided to reduce standby current in a large semiconductor memory. U.S. Pat. No. 6,072,732 considered to McClure describes a method whereby a reset is applied after a fixed delay following activation of a word line in a memory device during a memory write sequence. This minimizes access time and prevents simultaneous writing of sequentially addressed word lines.

SUMMARY OF THE INVENTION

A principal object of the present invention is to provide a method that prevents simultaneous addressing in the word line in a semiconductor memory, thereby eliminating memory errors.

Another object of the present invention is to provide a method that prevents simultaneous addressing in the word line in a semiconductor memory allowing for faster performance of the addressing circuit in the memory.

Another object of the present invention is to provide a method that prevents simultaneous addressing in the word line in a semiconductor memory, thereby eliminating memory errors and allowing for faster performance of the addressing circuit in the memory.

A still further object of the present invention is to provide a circuit that prevents simultaneous addressing in the word line in a semiconductor memory, thereby eliminating memory errors.

A yet further object of the present invention is to provide a circuit that permits a reduction in clock cycle time, thereby reducing memory address cycle time.

Another object of the present invention is to provide a circuit that prevents simultaneous addressing in the word line in a semiconductor memory, thereby eliminating memory errors and permits a reduction in clock cycle time thereby reducing memory address cycle time.

These objects are achieved by using a method where a reset circuit sends signals to the global X-address latch and the local X-address latch. The reset circuit initializes all global signals and main word lines prior to the end of each address cycle. By doing this, there is no overlap of main word line signal selection between successive addressing signals thereby prevents simultaneous addressing and the resulting memory error. Using the reset signal to terminate addressing, the address cycle time may be reduced.

BRIEF DESCRIPTION OF THE DRAWINGS

In the accompanying drawings forming a material part of this description, there is shown.

DESCRIPTION OF THE PREFERRED EMBODIMENTS

Figure 5:
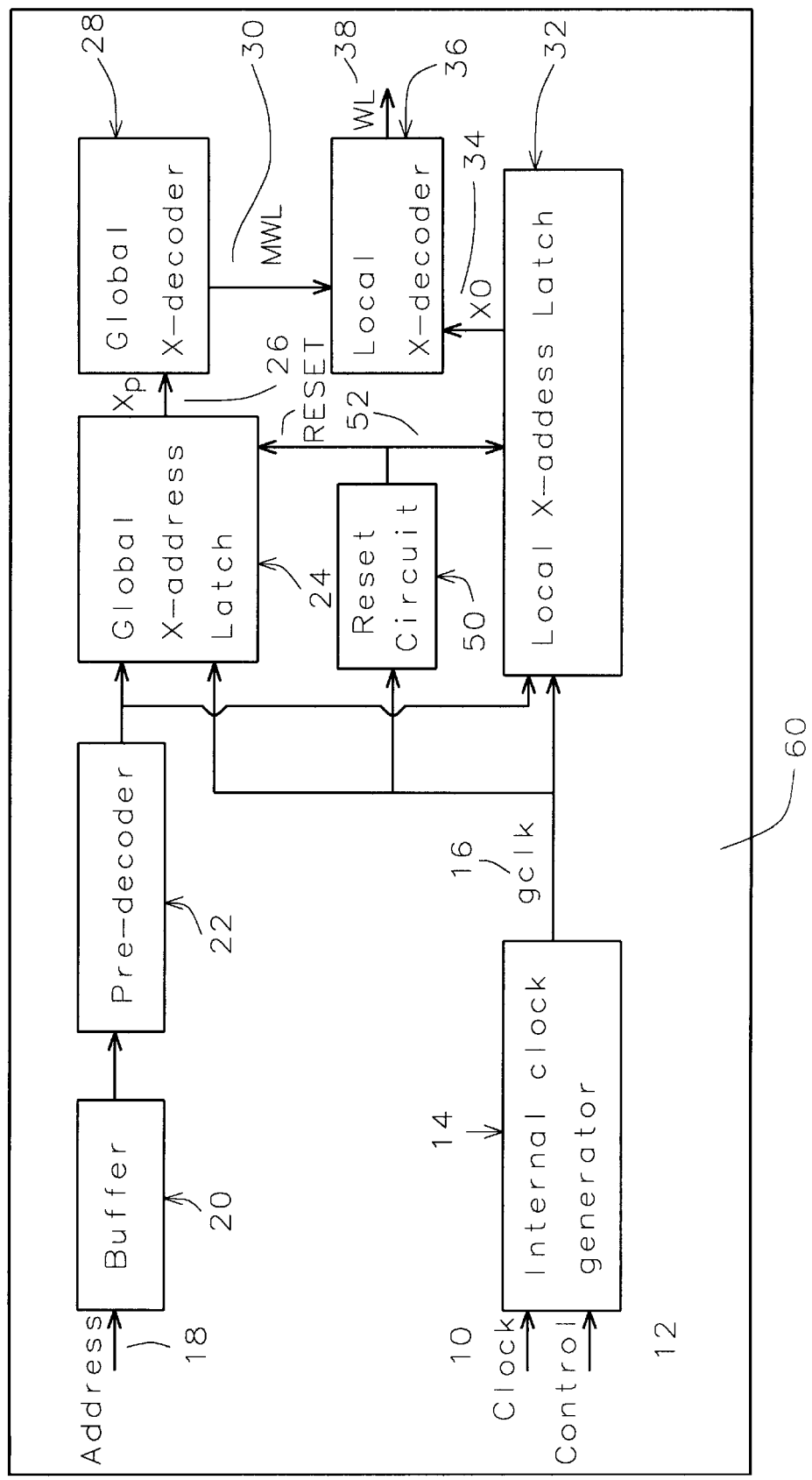

Refer now to FIG. 5, depicting in block diagram the X-decoder of the present invention. The X-decoder is identical to that described in the prior art of FIG. 1 with a few exceptions. A reset circuit 50 is added. The reset circuit 50 receives the gclk signal 16 and provides a reset signal 52 to the global X-address latch 24 and the local X-address latch 32.

Figure 1:
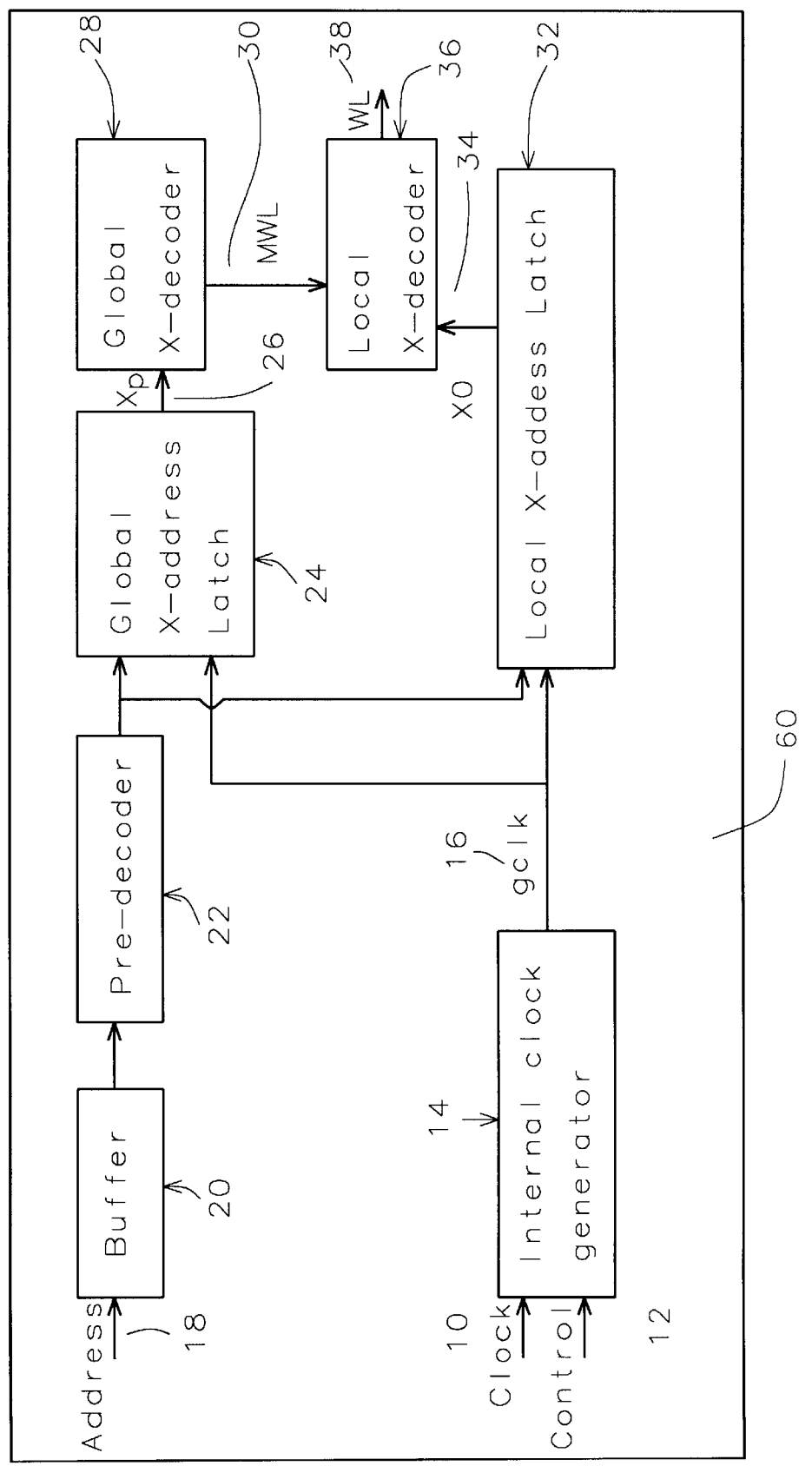
FIG. 1 illustrating in a block diagram an example of an X-decoder used in a semiconductor memory, FIG. 2 illustrating the signal timing for the example X-decoder of FIG. 1, FIG. 3 illustrating in a schematic an example of a word line decoder used in a semiconductor memory, FIG. 4 illustrating the signal timing for the example word line decoder of FIG. 3, FIG. 5 illustrating in a block diagram the X-decoder of the present invention, and FIG. 6 illustrating the signal timing for the X-decoder of FIG. 3 of the present invention.
Figure 2:
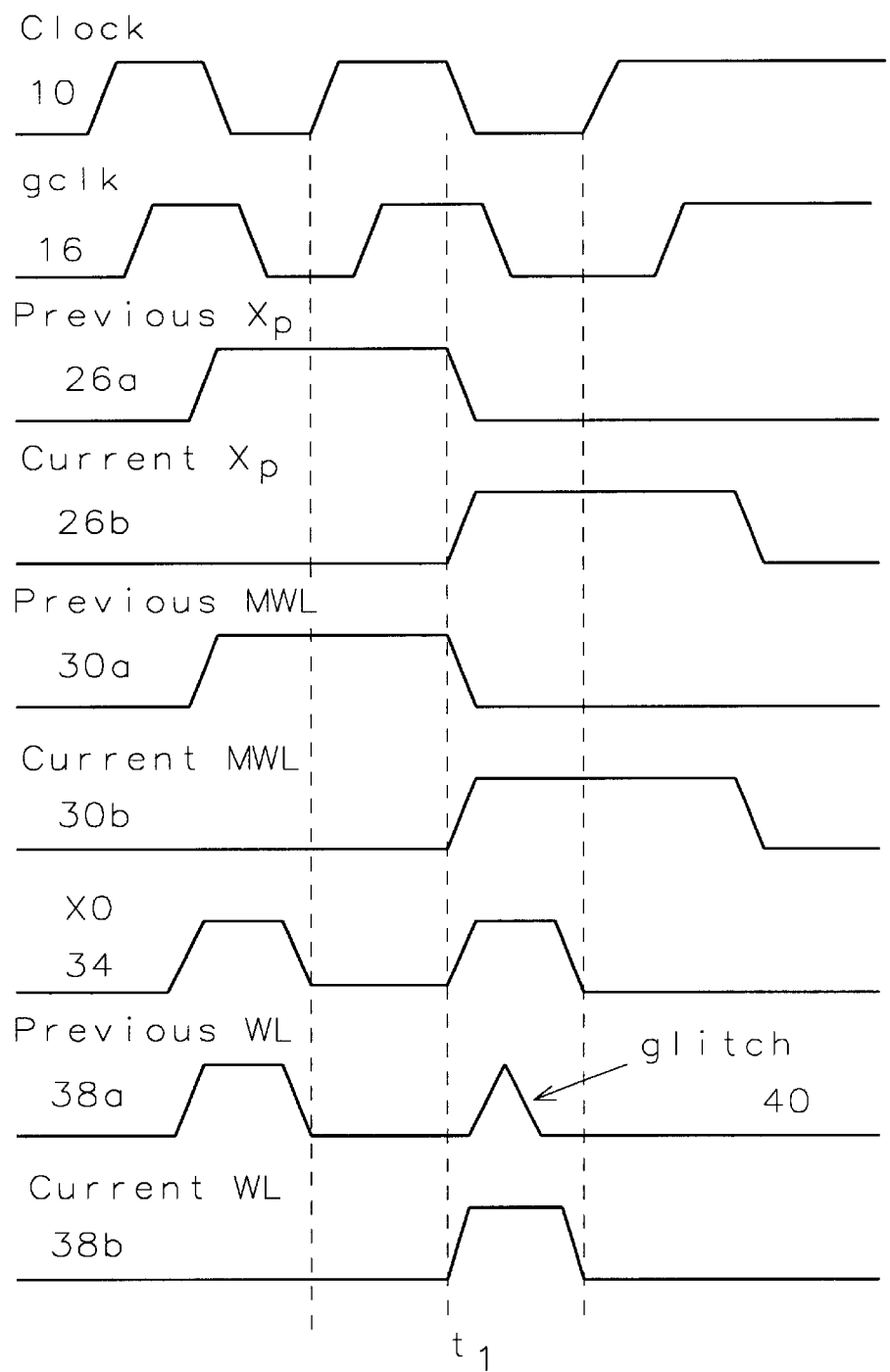
Figure 3:
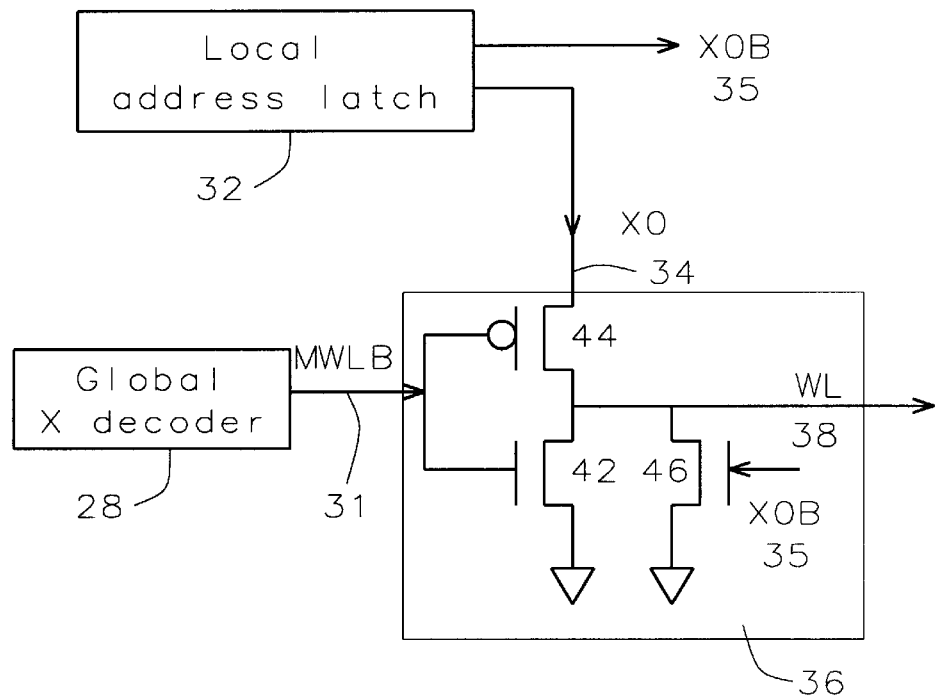
Figure 4:
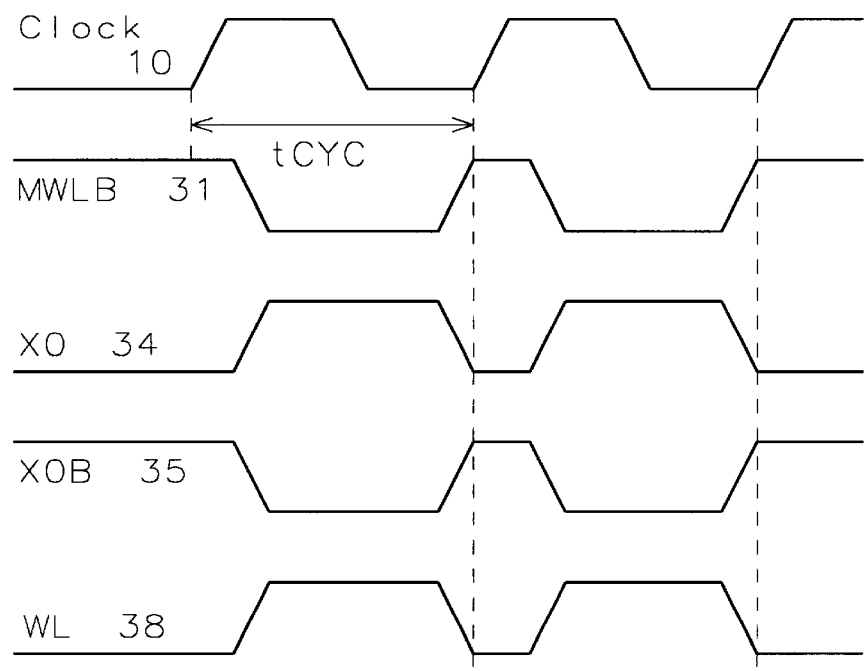
Figure 6:
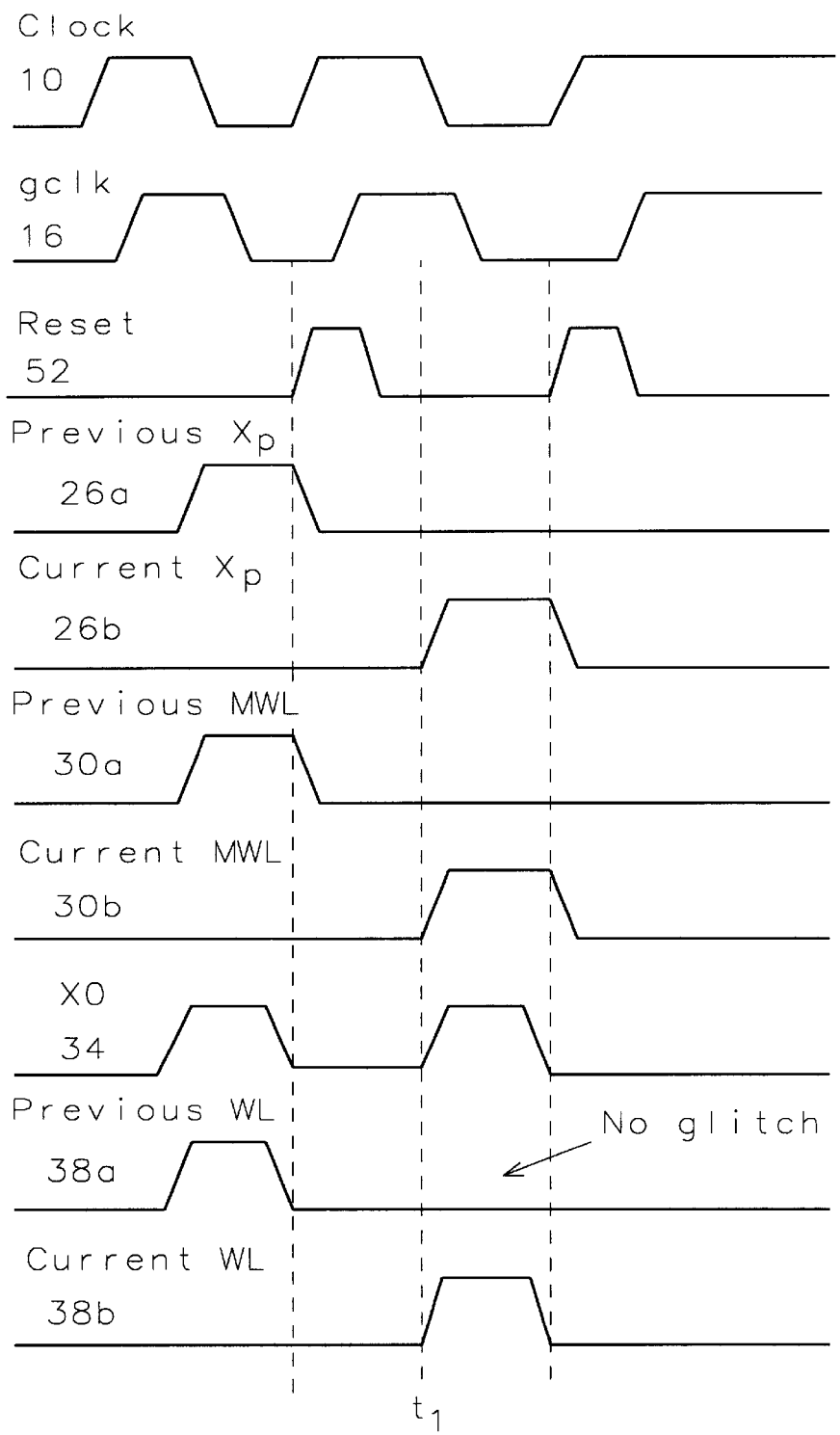

FIG. 6 describes the timing relationship between signals in the X-decoder block diagram of the present invention from FIG. 5. Referring now to both FIG. 5 and FIG. 6, notice that gclk 16 follows clock 10 after a propagation delay. Following a second delay after the gclk 16, global address signals (Xp) 26a and 26b are generated on the output of the global X-address latch 24. Global address signal (Xp) 26a illustrates one valid address occurring after the first pulse of the clock 10 and global address signal (Xp) 26b illustrates a different valid address occurring after the second pulse of the clock 10. The reset signal 52 resets the global address signals (Xp) 26a and 26b. This shortens the length of the global address signals (Xp) 26a and 26b such that the switching of the two signals does not occur simultaneously. Signals on main word lines (MWL) 30a and 30b correspond to decoding of global address signals (Xp) 26a and 26b, respectively after a propagation delay. Signals on main word lines (MWL) 30a and 30b are indicative of two distinct main word lines (MWL) 30a and 30b being selected. Signal X0 34 follows gclk 16 after a delay and is also reset by reset signal 52. Signals on the distinct word lines 38a and 38b correspond to the aforementioned main word lines (MWL) 30a and 30b. Word line 38a is selected when both X0 34 and main word line (MWL) 30a are high Word line 38b is selected when both X0 34 and main word line (MWL) 30b are high. Since the main word line (MWL) 30a is making a high to low transition well before main word line (MWL) makes a low to high transition, the glitch encountered in the examples of FIG. 1 and 2 is eliminated. This prevents both word lines 38a and 38b from being selected simultaneously.

The present invention provides an improvement in addressing of memory devices by eliminating simultaneous addressing of consecutively addressed memory locations. The invention is applicable to a variety of memory devices including SRAM, DRAM, ROM, and flash EEPROM memory devices. This prevents momentary glitches in addressed locations, which could result in invalid memory writing or reading. The present invention accomplishes this by application of a,reset pulse to the local and global address latches prior to the completion of the address cycle. This resets those latches and effectively de-addresses all word lines prior to application of the next address. By terminating addressing with the reset, address cycle time may be reduced.

The present invention differs from the prior art citation of McClure (U.S. Pat. No. 6,072,732) in that the reset of the address lines in the present invention is generated internally and is used to halt addressing on both read and write operations. The prior art of McClure generates the reset using the write bit lines and only resets address lines during memory write operations.

While the invention has been particularly shown and described with reference to the preferred embodiments thereof, it will be understood by those skilled in the art that various changes in form and details may be made without departing from the spirit and scope of the invention.

What is claimed is:

1. A method of preventing simultaneous addressing of multiple word lines in a memory device wherein a reset pulse is provided to a global address latch to terminate addressing of each of said word lines prior to the completion of the addressing cycle.

2. The method according to claim 1 wherein said addressing occurs during a read operation.

3. The method according to claim 1 wherein said addressing occurs during a write operation.

4. The method according to claim 1 wherein said memory device is selected from the group consisting of a static random access memory (SRAM), a dynamic random access memory (DRAM), a read only memory (ROM), and a flash electrically erasable programmable read only memory (Flash EEPROM).

5. The method according to claim 1 wherein a reset pulse is also provided to a local address latch.

6. The method according to claim 5 wherein said reset pulse initializes said global and said local x-address latches prior to completion of the addressing cycle to shorten the length of the addressing signals thereby preventing simultaneous addressing of said multiple word lines.

7. A method of preventing simultaneous addressing of multiple word lines in a memory device wherein a reset pulse is provided to a local address latch to terminate addressing of each of said word lines prior to the completion of the addressing cycle.

8. The method according to claim 7 wherein said memory device is selected from the group consisting of a static random access memory (SRAM), a dynamic random access memory (DRAM), a read only memory (ROM), and a flash electrically erasable programmable read only memory (Flash EEPROM).

9. The method according to claim 7 wherein a reset pulse is also provided to a global address latch.

10. The method according to claim 9 wherein said reset pulse initializes said global and said local x-address latches prior to completion of the addressing cycle to shorten the length of the addressing signals thereby preventing simultaneous addressing of said multiple word lines.

11. The method according to claim 7 wherein said addressing occurs during a read operation.

12. The method according to claim 7 wherein said addressing occurs during a write operation.

13. A method of preventing simultaneous addressing of multiple word lines in a memory device wherein a reset pulse initializes global and local x-address latches prior to completion of the addressing cycle to shorten the length of the addressing signals thereby preventing simultaneous addressing of said multiple word lines.

14. The method according to claim 13 wherein said memory device is selected from the group consisting of a static random access memory (SRAM), a dynamic random access memory (DRAM), a read only memory (ROM), and a flash electrically erasable programmable read only memory (Flash EEPROM).

15. The method according to claim 13 wherein said addressing occurs during a read operation.

16. The method according to claim 13 wherein said addressing occurs during a write operation.

17. A method of preventing simultaneous addressing of multiple word lines in a memory device whereby a reset pulse is provided to the global address latch and to the local address latch thereby terminating addressing of each of said word lines prior to the completion of the addressing cycle.

18. The method according to claim 17 wherein said memory device is selected from the group consisting of a static random access memory (SRAM), a dynamic random access memory (DRAM), a read only memory (ROM), and a flash electrically erasable programmable read only memory (Flash EEPROM).

19. The method according to claim 17 wherein said addressing occurs during a read operation.

20. The method according to claim 17 wherein said addressing occurs during a write operation.

21. The method according to claim 17 wherein said initializing of said global and local x-address latches prior to completion of the addressing cycle shortens the length of the addressing signals thereby preventing simultaneous addressing of said multiple word lines.

22. A reset circuit for preventing simultaneous addressing of multiple word lines in a memory device whereby said reset circuit initializes global and local x-address latches prior to completion of the addressing cycle thereby preventing simultaneously addressing said multiple word lines.

23. The device according to claim 22 wherein said memory device is selected from the group consisting of a static random access memory (SRAM), a dynamic random access memory (DRAM), a read only memory (ROM), and a flash electrically erasable programmable read only memory (Flash EEPROM).

24. The device according to claim 22 wherein said initializing of said global and local x-address latches prior to completion of the addressing cycle shortens the length of the addressing signals thereby preventing simultaneous addressing of said multiple word lines.

25. The device according to claim 22 wherein said addressing occurs during a read operation.

26. The device according to claim 22 wherein said addressing occurs during a write operation.

* * * * *